US012762297B2

(12) United States Patent
Chakravarty et al.

(10) Patent No.: US 12,762,297 B2
(45) Date of Patent: Oct. 13, 2026

(54) ARTIFICIAL INTELLIGENCE (AI)-BASED SELF-GOVERNING INFRASTRUCTURE

(71) Applicant: Bank of America Corporation, Charlotte, NC (US)

(72) Inventors: Srinath Chakravarty, Plano, TX (US); Kenneth Boyd, Richmond, VA (US); Dinesh Kumar Agrawal, Rowlett, TX (US); Stephen Belton, Garden City, NY (US); Aravind Singtalur, McKinney, TX (US); Steven Greene, New York, NY (US); Petar Puskarich, Plano, TX (US); Elina Shkodnik, Staten Island, NY (US); Kerry Vaughan, Pennington, NJ (US); Manmohan V. Datla-Viswasai, Frisco, TX (US)

(73) Assignee: Bank of America Corporation, Charlotte, NC (US)

( * ) Notice: Subject to any disclaimer, the term of this patent is extended or adjusted under 35 U.S.C. 154(b) by 746 days.

(21) Appl. No.: 18/227,371

(22) Filed: Jul. 28, 2023

(65) Prior Publication Data

US 2025/0036821 A1 Jan. 30, 2025

(51) Int. Cl.
*G06F 30/13* (2020.01)

(52) U.S. Cl.
CPC .................................... *G06F 30/13* (2020.01)

(58) Field of Classification Search
CPC ........................................................ G06F 30/13
See application file for complete search history.

(56) References Cited

U.S. PATENT DOCUMENTS

| | | | | |
|---|---|---|---|---|
| 2023/0114461 A1* | 4/2023 | Wilberforce ....... | G05B 13/0265 700/276 |
| 2024/0144138 A1* | 5/2024 | Cella ................ | G05B 19/41885 |
| 2024/0385866 A1* | 11/2024 | Peterson ............... | G06F 9/4401 |

* cited by examiner

*Primary Examiner* — Kenneth B Lee, Jr.
(74) *Attorney, Agent, or Firm* — Weiss & Arons LLP

(57) ABSTRACT

A method of using an Artificial Intelligence (AI) self-governing infrastructure design, is provided. The method provides an AI-aware, self-governing, infrastructure design which prompts the design to requisition constituent components required for a build-out of the design. In response to the prompting, the method may include using the design to initiate a plurality of tickets. The plurality of tickets procures constituent components and confirms that the initiated tickets are sufficient to place the design in a condition of viability. Following the fulfillment of the tickets, the infrastructure self-certifies operability and seeks end-user acceptance of the operability of the build-out. The design is maintained as decision-making capable, and further configured to selectively receive human intervention. The human intervention enables design customization. The design manages physical shutdown of ports and connections, creates a second plurality of tickets for taking pre-determined entries off the design record and schedules decommissioning of existing constituents.

18 Claims, 5 Drawing Sheets

MATURITY STAGE [AI-based Self Governing Infrastructure] Process Diagram

LMS Analyzed [AI-based Self Governing Infrastructure]

Quantified Lifecycle section of Use Cases (illustration)

For M lifecycle phases, e.g. build/deploy/decom/possibly others - each having N stages in itself e.g. build has procure provision install certify etc. deploy has schedule performance release change and so on (to m=name a few), AI selects path of *least* resource loss (i.e. max gain) to the entity - in the following manner:

502 1. ERC = SUM {i=1,N j=1,M, k=1,L} [EV (i,j,k)] at each k fulfilling 2. below, where 504 2. EV (i,j,k) = MIN {Prob (i,j,k) x Cost (i,j,k)} at given stage(i)and phase(j) where 506 2a. L = total lanes available at each decision point in multi-step N stage(s), 508 2b. Prob = likelihood of occurrence = 1 - (value of opposite odds), 510 2c. Resource Cost = lost (earned) value including time and resource utilizations, 512 3. SUM (k=1, L) {Prob (i,j,k)} = 100% at a given i from 1...N, j from 1...M AI "knows" 2a, 2b, 2c from learning (e.g. earned value from past projects), when that does not suffice it attempts input from current state, if still short of data to calculate, goes on hold pending human intervention to estimate.

AI able to "improve" calculation of individual EVs (expected Values) and integrated ERC (Effective Resource consumption)each cycle, comparing with actual schedule, resource consumption, utilization as it executes each stage(i)of multiphase(j) initiative.

FIG. 5

ARTIFICIAL INTELLIGENCE (AI)-BASED SELF-GOVERNING INFRASTRUCTURE

FIELD OF TECHNOLOGY

Aspects of the disclosure relate to administration of entity infrastructure.

BACKGROUND OF THE DISCLOSURE

In relatively large-infrastructure entities (like legal and financial entities), increased numbers of physical and virtual devices are provided to meet new project requirements.

Often, these devices are provided in data center settings which may have raised floor environments and other complex build requirements. Such complex build requirements may involve high lead times to build/complete. Such added numerous complexities may also involve highly-resource-consumptive team engagements, multiple reworking of plans, and certification at different functional stages.

It would be desirable to leverage AI to improve the approach to dealing with such increases in complexity associated with the build requirements associated with infrastructure projects in relatively large-infrastructure entities.

SUMMARY OF THE DISCLOSURE

The proposed embodiments as set forth herein provide AI-equipped intelligent systems which commission required devices based on design specifications. These design specifications preferably extend from the point in time of selecting each hardware stack to promoting it through each hardware stack's individual lifecycle.

These specifications preferably are enabled to engage required teams with auto-generated tickets for certification purposes. The specifications can conduct quality checks on the infrastructure project itself. In some embodiments, the specifications may monitor for potential design modifications. In certain embodiments, the specifications may generate an infrastructure build baseline.

Infrastructure builds are known to be the single largest time sink and loss/rework generators in data centers. This disclosure directly addresses such issues—from concept through implementation and production readiness, including decommissions. Preferably, the disclosure sets forth a process goal to enable such systems to reduce or eliminate errors and inefficiencies, while taking supplanting manual actions needed to individually manage hardware lifecycles while adapting to market conditions.

An AI data store of available infrastructure is preferably accessed by an application interface where design baseline and requirements' specifications are both input by project teams. The back-end data engine then preferably sources, in some embodiments, infrastructure and related devices already available.

This sourcing preferably initiates in response to the request. The sourcing preferably initiates by auto-generating a demand requisition.

Once hardware is confirmed available ("sighted" by system) the backend operates on parallel streams per each device type. This requisitioning proceeds all the way from placement, rack, stack, build, connectivity, environmental readiness (by lane), to pre-production. Infrastructure test and certification may be conducted and approved at each stage, in addition to respective support teams engaged along the way.

In effect, this is an overarching system of cradle-to-grave management of hardware devices within a data center infrastructure. Systems according to the embodiments can also preferably include decommissioning and shutting down processes with depreciation and accounting closure modules to facilitate the economic aspects of the shutdown.

Self-governing infrastructure systems according to the disclosure can preferably be programmed for different levels of autonomy based upon the entity's maturity. This programming is preferably set forth in addition to including self-learning abilities through the life cycles of many different project deliverables requiring similar, or even the same, infrastructures.

An AI data store of available infrastructure information is preferably accessed by an application interface. In such a data store, design baseline and requirements specifications are both input by project teams. The back end data engine then sources infrastructure and requisitions devices either already available or to be purchased. In the latter case, the system preferably auto-generates a demand requisition.

In embodiments of the disclosure, non-transitory computer-readable memory storing computer-executable instructions that, when executed by a processor on a computer, cause the computer to perform a method for supporting an Artificial Intelligence (AI) self-governing infrastructure design. The instructions may provide the AI-aware, self-governing, infrastructure design. The instructions may also prompt the design to requisition constituent components required for a build-out of the design.

In response to the prompting, the method may further include using the design to initiate a plurality of tickets. The plurality of tickets may initiate procuring constituent components.

The method may further involve using the design to confirm that the initiated tickets, upon fulfillment of the tickets, are sufficient to place the design in a condition of viability. Following the fulfillment of the tickets, and placing and installing the procured constituents, the method uses the design to self-certify operability. Following the self-certification, the method may involve using the design to seek end-user acceptance of the operability of the build-out of the design.

The method may also include maintaining the AI design as decision-making capable. In addition, the design may be further configured to receive human intervention, where necessary. It should be noted that, in certain embodiments, the level of human intervention may be programmed for different levels of autonomy. Such levels of autonomy may be based, for example, on the level of maturity of the entity. Accordingly, more human intervention may be leveraged for a relatively new entity because such a new entity may have less established protocols. Less human intervention may be leveraged for a more mature entity because a more mature entity may have more established protocols and require less oversight. As such, the leveraging of human intervention may be tunable on one or more other factors. In addition, the human intervention may preferably enable various additional aspects of design customization. Design customization may include, but not be limited to, specialty build-out scenarios, unique choices of constituent components, timing requirements, etc.

The method may also include maintaining the AI design as decision-making capable. Furthermore, the method may include receiving human intervention that enables design self-correction. Such human intervention may enable aspects of, and provide an interface for, human design correction.

The methods may further involve using the design to self-certify operability only after the placement of the procured constituent components. In some embodiments, the methods may involve using the design to install the procured constituent components.

BRIEF DESCRIPTION OF THE DRAWINGS

The objects and advantages of the disclosure will be apparent upon consideration of the following detailed description, taken in conjunction with the accompanying drawings, in which like reference characters refer to like parts throughout, and in which:

FIG. 5 shows a schematic diagram of a Lifecycle Management Solutions (LMS) analysis for an AI-based Self-Governing Infrastructure, including a Quantified Lifecycle section of Use Cases in accordance with the disclosure as set forth herein.

DETAILED DESCRIPTION OF THE DISCLOSURE

Figure 1:
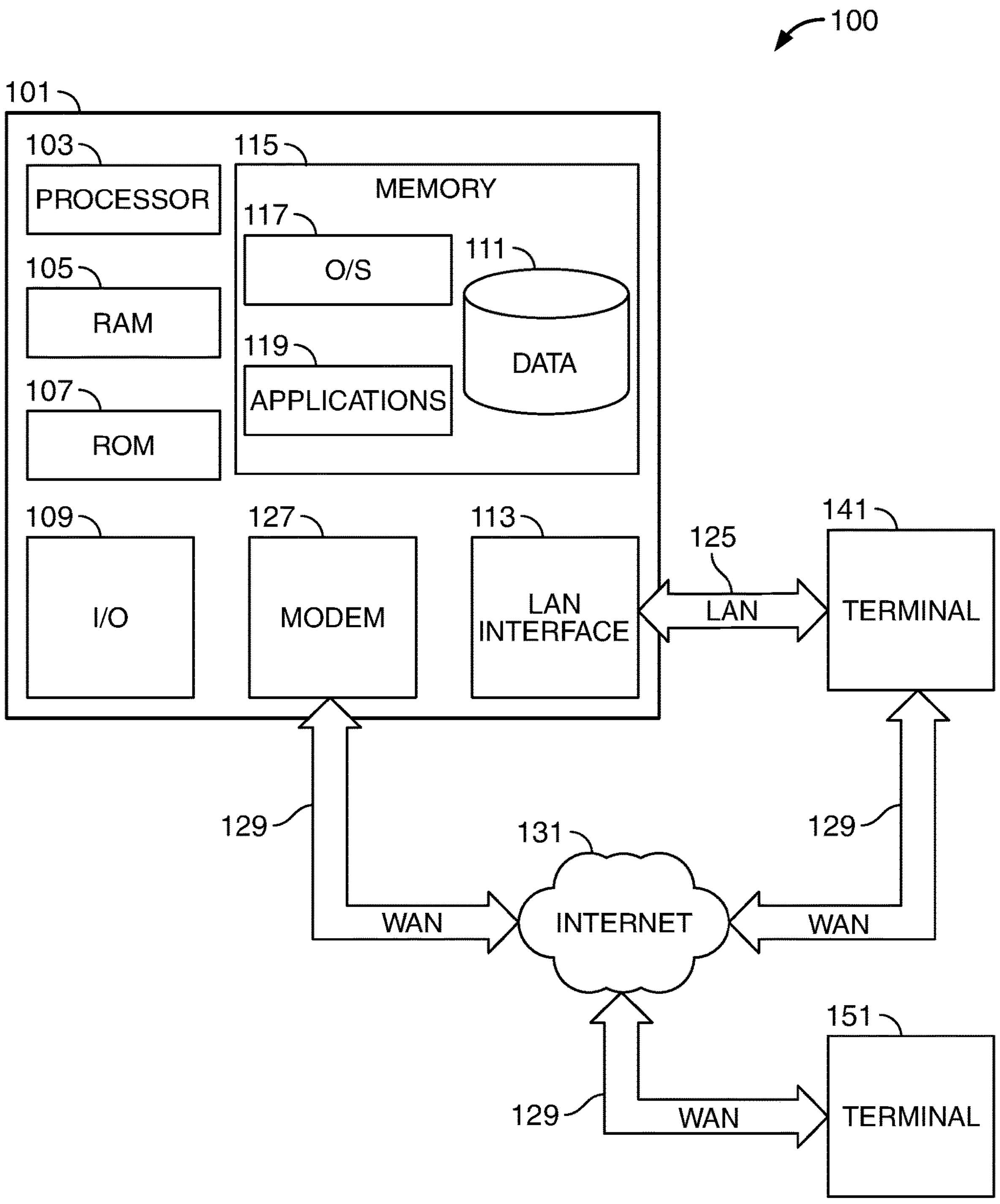
FIG. 1 shows an illustrative system in accordance with principles of the disclosure.

A vast majority of automation occurs as pre-scripted set of actions designed to complete, preferably absent human intervention, sequences of tasks. Interacting with human intelligence could be considered "Intelligent Automation". However, such Intelligent Automation lacks autonomy to the extent that it does not make its own decisions nor can Intelligent Automation self-correct decisions based on the outcome. While lessons from past experience can be coded into new versions, these lessons do not necessarily dynamically and instantly carry forward.

The default behavior of most automation with regard to exception handling is to switch to semi-automatic or fully-manual mode in order to allow for human intervention. Fully-operative AI systems, on the other hand, can preferably self-correct, make decisions, and/or resort to alternative paths in a way that is similar to the human mind. Importantly, AI draws upon history of applicable cases and consequences, bringing that learning to bear upon current situations.

As Intelligent Automation increases in "Intelligence", Intelligent Automation asymptotes to AI by definition. The concept of introducing AI systems to manage infrastructure and make it self-governing, represents a significant step beyond presently available automated solutions. Self-governing infrastructure management exhibits advantages of scale. Such advantages include delivering small infrastructure deliverables for use in entire management lifecycles. Preparation and distribution of such deliverables can be handled successfully by a mature AI system, such as an AI system according to the disclosure.

Other unique capabilities of AI concepts according to the disclosure include interacting with human actors on the AI's own terms. Examples of such interacting include alerting, reminding, informing, prompting action, and even escalating through hierarchical tiers of individuals, if necessary, to risk mitigate negative fallout.

Such AI systems can preferably dynamically adopt new standards, release cycles, best practices, and account for technology obsolescence. These are all critical adaptations in regulated areas such as, for example, banking, legal, government, and transportation, where information technology (IT) infrastructure plays a critical role.

True AI can "reverse the gaze", to the extent that it can step back or forward in autonomy, self-check to decide when to seek human intervention, and perform these action on its own terms. AI according to the disclosure uses automation-like strategies to leverage tasks. Furthermore, IT infrastructure can offer additional efficacious evolution from current automated processes.

The following are four use cases for AI according to the disclosure: Commissioning New Infrastructure, Production Promotion (steady state operations), Decommissioning, Shutting down and Salvaging, and Lifecycle Management Solutions (LMS).

Commissioning New Infrastructure

Embodiments of the disclosure include an AI-aware finalized infrastructure design. Such a design represents its own "life form" at the inception stage, to the extent that it is built with a capacity to ask for what it needs in order to grow and be delivered on time.

Such a design can initiate tickets to procure/place/install, and develop itself to a point of viability. At such a point of viability, the design is ready to self-certify and seek end-user acceptance. In these sub-phases, the AI module maintains its decision-making visible and open to human intervention to enable aspects of customization/correction/safety.

Production Promotion (Steady State Operations)

Other embodiments relate to an installed/developed IT infrastructure. Such an IT infrastructure is ready for operation when it can fully enter a production environment and transition to steady state operations. In this case an AI module according to the disclosure launches deployment automation, validates capacity, and/or self-corrects configurations to meet design baseline for performance requirements. In addition, such embodiments can use known information to monitor and/or burn-in a warranty period for acceptance in common purchases, where such purchases comply with organizational culture and/or regulations.

Decommission, Shutdown, and Salvage

All IT infrastructure eventually sunsets due to changed business conditions, technology obsolescence, performance, and regulatory requirements. A mature AI according to the disclosure manages physical shutdown of ports and connections, creates tickets for taking the entries off the financial record, successfully schedules decommissions to maximize the benefits of asset depreciation, and extracts residual value from salvaging physical hardware.

Lifecycle Management Solutions (LMS)

AI can integrate phases of IT infrastructure life, and manage them independently and/or intelligently to suit specific projects. To reiterate, not everything proceeds from build to production and then to decommission linearly. Many requirements involve deep review of legacy infrastructure installations and/or root cause/analyses/fixes. Such a system according to the disclosure learns from history, and takes knowledge forward to preferably solve future problems autonomously.

A computer-readable media storing computer-executable instructions that, when executed by a processor on a computer, cause the computer to perform a method for maintaining steady-state operation of an Artificial Intelligence (AI) self-governing infrastructure design is provided. The method includes providing the AI-aware, self-governing, infrastructure design, launching deployment automation of the design, and using the design to validate correspondence of a design capacity to an existing infrastructure capacity specification. Upon a failure to validate the correspondence of the design capacity to the existing infrastructure capacity specification, the design self-corrects—i.e., the design puts itself in a position to recreate itself in order to meet the capacity of the existing infrastructure capacity specification.

In response to the self-correcting, the method may use the design to initiate a plurality of tickets. The plurality of tickets may procure constituent components. The design may confirm that the initiated tickets, upon fulfillment of the tickets, are sufficient to correspond the design to the existing infrastructure capacity specification.

Following the fulfillment of the tickets, the methods may use the design to self-certify correspondence of the design to the existing infrastructure capacity specification and to self-certify operability. The method may use the design to seek end-user acceptance of the correspondence to the existing infrastructure capacity specification and operability of a self-corrected build-out of the design. The method may also monitor the design to confirm that the design is decision-making capable and configured to receive human intervention. The human intervention may be used to enabling a plurality of aspects of design customization.

The method may maintain the AI design as decision-making capable and capable of receiving human intervention. The human intervention may enable aspects of design correction. The design may be further configured to place the procured constituent components.

The design may include installation of the procured constituent components. While using the design may cause self-certification of operability, this self-certification may occur only after the installation of the procured constituent components. The method may include receiving and recording warranty information for the procured components.

The following figures and associated written specifications set forth the invention in additional detail to the foregoing.

Apparatus and methods described herein are illustrative. Apparatus and methods in accordance with this disclosure will now be described in connection with the figures, which form a part hereof. The figures show illustrative features of apparatus and method steps in accordance with the principles of this disclosure. It is to be understood that other embodiments may be utilized and that structural, functional and procedural modifications may be made without departing from the scope and spirit of the present disclosure.

The steps of methods may be performed in an order other than the order shown or described herein. Embodiments may omit steps shown or described in connection with illustrative methods. Embodiments may include steps that are neither shown nor described in connection with illustrative methods.

Illustrative method steps may be combined. For example, an illustrative method may include steps shown in connection with another illustrative method.

Apparatus may omit features shown or described in connection with illustrative apparatus. Embodiments may include features that are neither shown nor described in connection with the illustrative apparatus. Features of illustrative apparatus may be combined. For example, an illustrative embodiment may include features shown in connection with another illustrative embodiment.

FIG. 1 shows an illustrative block diagram of system 100 that includes computer 101. Computer 101 may alternatively be referred to herein as an "engine," "server" or a "computing device." Computer 101 may be a workstation, desktop, laptop, tablet, smartphone, or any other suitable computing device. Elements of system 100, including computer 101, may be used to implement various aspects of the systems and methods disclosed herein. Each of the systems, methods and algorithms illustrated below may include some or all of the elements and apparatus of system 100.

Computer 101 may have a processor 103 for controlling the operation of the device and its associated components, and may include RAM 105, ROM 107, input/output ("I/O") 109, and a non-transitory or non-volatile memory 115. Machine-readable memory may be configured to store information in machine-readable data structures. Processor 103 may also execute all software running on the computer. Other components commonly used for computers, such as EEPROM or Flash memory or any other suitable components, may also be part of the computer 101.

Memory 115 may be comprised of any suitable permanent storage technology—e.g., a hard drive. Memory 115 may store software including the operating system 117 and application program(s) 119 along with any data 111 needed for the operation of the system 100. Memory 115 may also store videos, text, and/or audio assistance files. The data stored in memory 115 may also be stored in cache memory, or any other suitable memory.

I/O module 109 may include connectivity to a microphone, keyboard, touch screen, mouse, and/or stylus through which input may be provided into computer 101. The input may include input relating to cursor movement. The input/output module may also include one or more speakers for providing audio output and a video display device for providing textual, audio, audiovisual, and/or graphical output. The input and output may be related to computer application functionality.

System 100 may be connected to other systems via a local area network (LAN) interface 113. System 100 may operate in a networked environment supporting connections to one or more remote computers, such as terminals 141 and 151. Terminals 141 and 151 may be personal computers or servers that include many or all of the elements described above relative to system 100. The network connections depicted in FIG. 1 include a local area network (LAN) 125 and a wide area network (WAN) 129 but may also include other networks. When used in a LAN networking environment, computer 101 is connected to LAN 125 through LAN interface 113 or an adapter. When used in a WAN networking environment, computer 101 may include a modem 127 or other means for establishing communications over WAN 129, such as Internet 131.

It will be appreciated that the network connections shown are illustrative and other means of establishing a communications link between computers may be used. The existence of various well-known protocols such as TCP/IP, Ethernet, FTP, HTTP and the like is presumed, and the system can be operated in a client-server configuration to permit retrieval of data from a web-based server or application programming interface (API). Web-based, for the purposes of this application, is to be understood to include a cloud-based system. The web-based server may transmit data to any other suitable computer system. The web-based server may also send computer-readable instructions, together with the data, to any suitable computer system. The computer-readable instructions may include instructions to store the data in cache memory, the hard drive, secondary memory, or any other suitable memory.

Additionally, application program(s) 119, which may be used by computer 101, may include computer executable instructions for invoking functionality related to communication, such as e-mail, Short Message Service (SMS), and voice input and speech recognition applications. Application program(s) 119 (which may be alternatively referred to herein as "plugins," "applications," or "apps") may include computer executable instructions for invoking functionality related to performing various tasks. Application program(s) 119 may utilize one or more algorithms that process received executable instructions, perform power management routines or other suitable tasks.

Application program(s) 119 may include computer executable instructions (alternatively referred to as "programs"). The computer executable instructions may be embodied in hardware or firmware (not shown). Computer 101 may execute the instructions embodied by the application program(s) 119 to perform various functions.

Application program(s) 119 may utilize the computer-executable instructions executed by a processor. Generally, programs include routines, programs, objects, components, data structures, etc., that perform particular tasks or implement particular abstract data types. A computing system may be operational with distributed computing environments where tasks are performed by remote processing devices that are linked through a communications network. In a distributed computing environment, a program may be located in both local and remote computer storage media including memory storage devices. Computing systems may rely on a network of remote servers hosted on the Internet to store, manage, and process data (e.g., "cloud computing" and/or "fog computing").

Any information described above in connection with data 111, and any other suitable information, may be stored in memory 115.

The invention may be described in the context of computer-executable instructions, such as application(s) 119, being executed by a computer. Generally, programs include routines, programs, objects, components, data structures, etc., that perform particular tasks or implement particular data types. The invention may also be practiced in distributed computing environments where tasks are performed by remote processing devices that are linked through a communications network. In a distributed computing environment, programs may be located in both local and remote computer storage media including memory storage devices. It should be noted that such programs may be considered, for the purposes of this application, as engines with respect to the performance of the particular tasks to which the programs are assigned.

Computer 101 and/or terminals 141 and 151 may also include various other components, such as a battery, speaker, and/or antennas (not shown). Components of computer system 101 may be linked by a system bus, wirelessly or by other suitable interconnections. Components of computer system 101 may be present on one or more circuit boards. In some embodiments, the components may be integrated into a single chip. The chip may be silicon-based.

Terminal 141 and/or terminal 151 may be portable devices such as a laptop, cell phone, tablet, smartphone, or any other computing system for receiving, storing, transmitting and/or displaying relevant information. Terminal 141 and/or terminal 151 may be one or more user devices. Terminals 141 and 151 may be identical to system 100 or different. The differences may be related to hardware components and/or software components.

The invention may be operational with numerous other general purpose or special purpose computing system environments or configurations. Examples of well-known computing systems, environments, and/or configurations that may be suitable for use with the invention include, but are not limited to, personal computers, server computers, handheld or laptop devices, tablets, mobile phones, smart phones and/or other personal digital assistants ("PDAs"), multiprocessor systems, microprocessor-based systems, cloud-based systems, programmable consumer electronics, network PCs, minicomputers, mainframe computers, distributed computing environments that include any of the above systems or devices, and the like.

Figure 2:
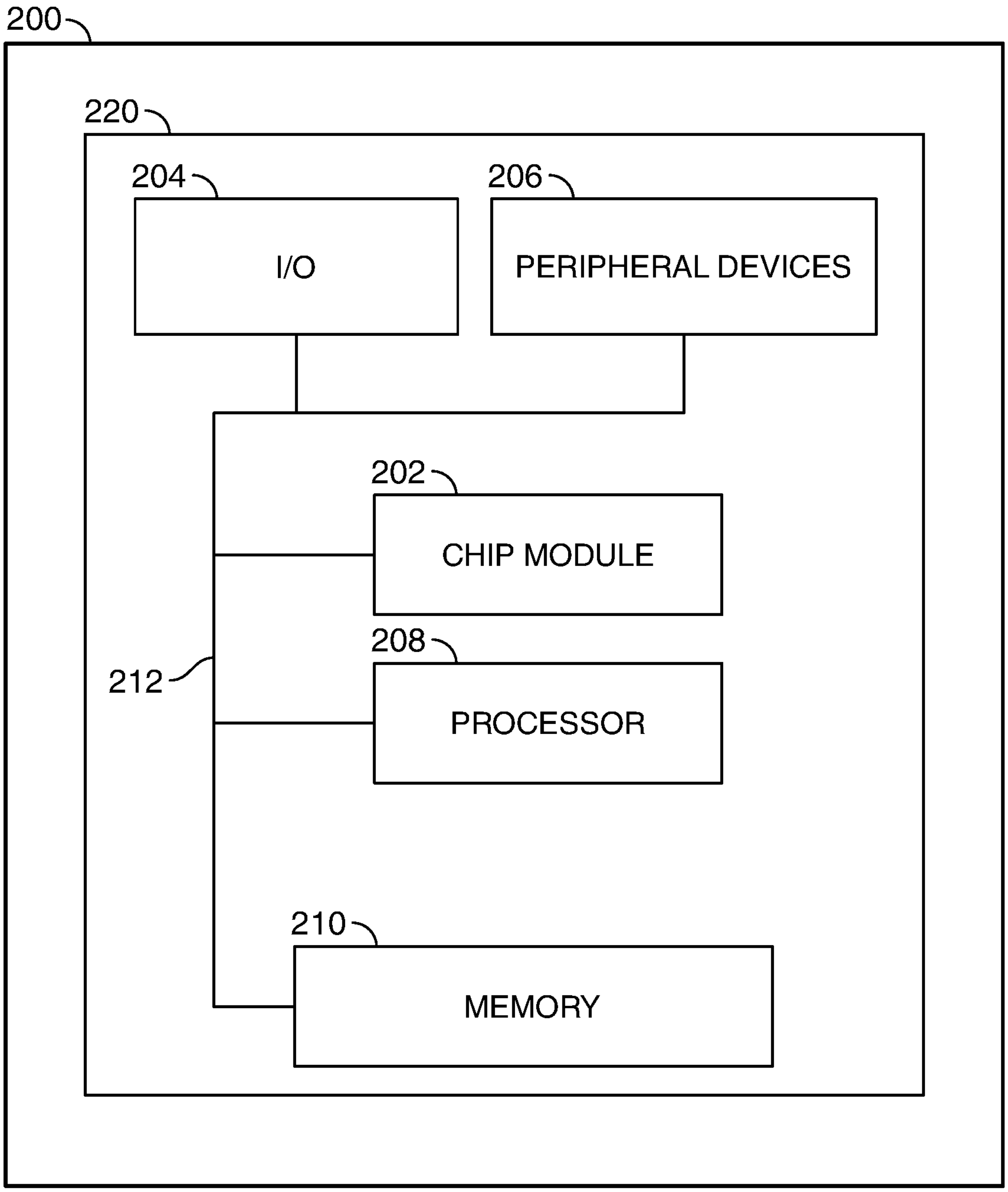
FIG. 2 shows an illustrative system in accordance with principles of the disclosure.

FIG. 2 shows illustrative apparatus 200 that may be configured in accordance with the principles of the disclosure. Apparatus 200 may be a computing device. Apparatus 200 may include one or more features of the apparatus shown in FIG. 2. Apparatus 200 may include chip module 202, which may include one or more integrated circuits, and which may include logic configured to perform any other suitable logical operations.

Apparatus 200 may include one or more of the following components: I/O circuitry 204, which may include a transmitter device and a receiver device and may interface with fiber optic cable, coaxial cable, telephone lines, wireless devices, PHY layer hardware, a keypad/display control device or any other suitable media or devices; peripheral devices 206, which may include counter timers, real-time timers, power-on reset generators or any other suitable peripheral devices; logical processing device 208, which may compute data structural information and structural parameters of the data; and machine-readable memory 210.

Machine-readable memory 210 may be configured to store in machine-readable data structures: machine executable instructions, (which may be alternatively referred to herein as "computer instructions" or "computer code"), applications such as applications 119, signals, and/or any other suitable information or data structures.

Components 202, 204, 206, 208 and 210 may be coupled together by a system bus or other interconnections 212 and may be present on one or more circuit boards such as circuit board 220. In some embodiments, the components may be integrated into a single chip. The chip may be silicon-based.

Figure 3:
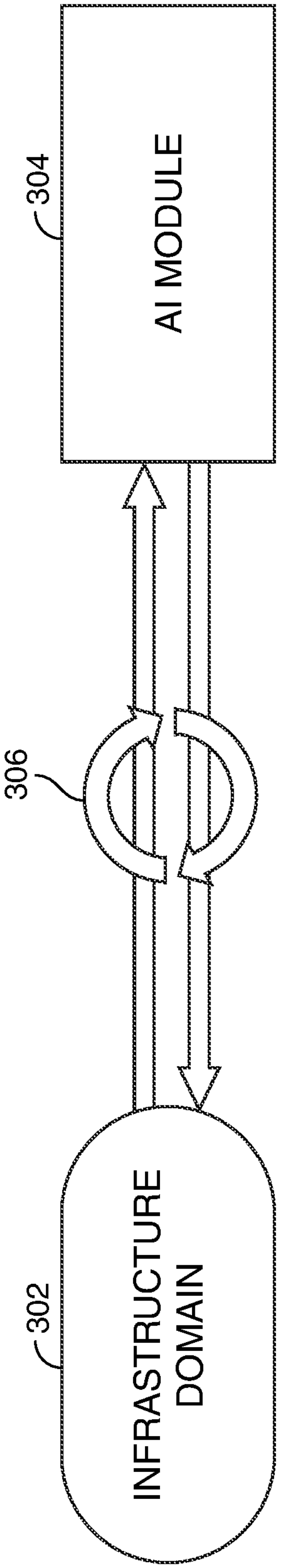
FIG. 3 shows a high-level schematic diagram of the interoperation of the infrastructure domain and the AI module in accordance with the principles of the disclosure.
Figure 4:
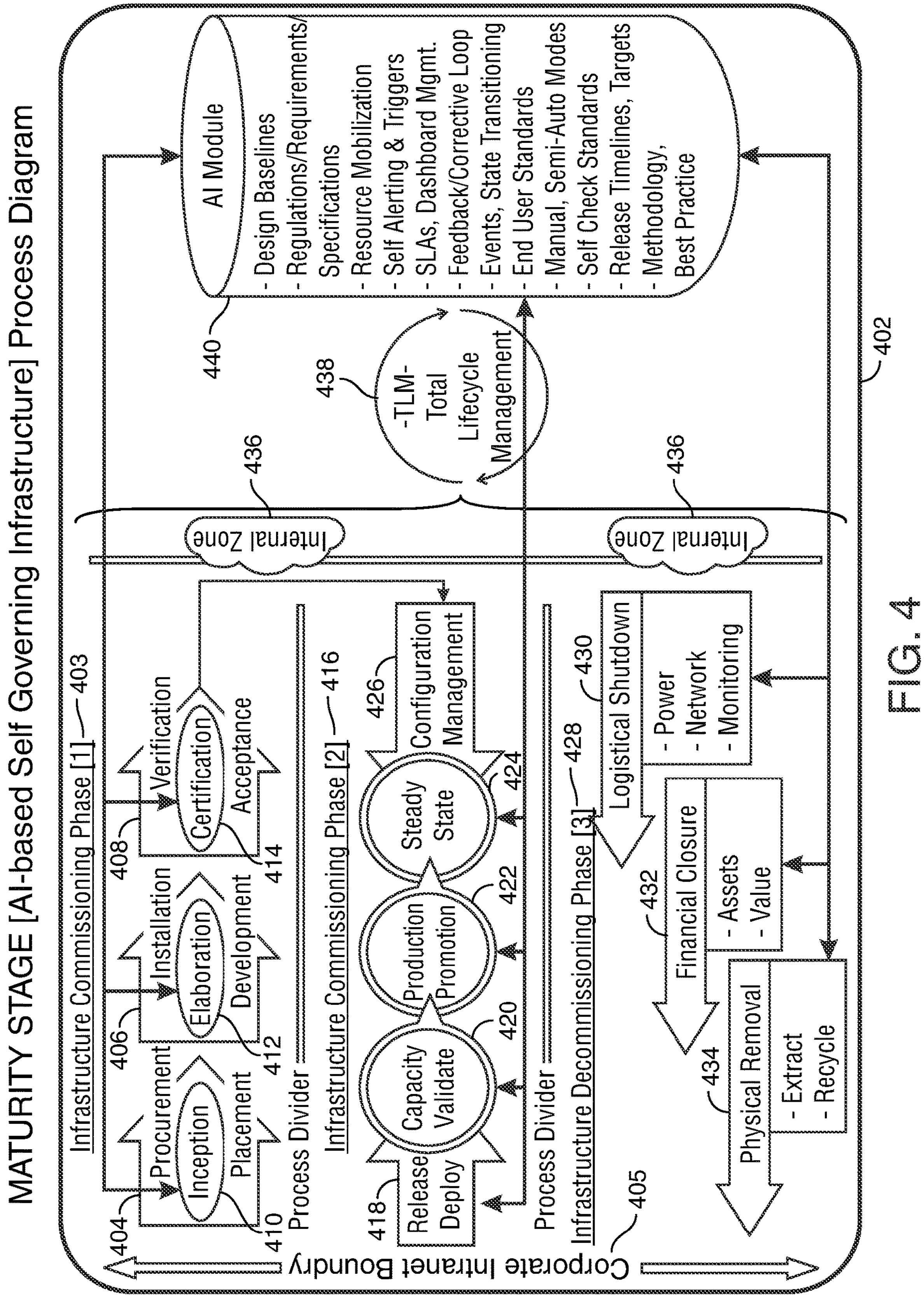
FIG. 4 shows a schematic diagram of a maturity stage AI-based Self-Governing Infrastructure Process.

FIG. 3 shows a high-level schematic diagram of the interoperation 306 of the infrastructure domain 302 and the AI module 304 in accordance with the principles of the disclosure. In the current disclosure, the infrastructure domain 302 may be considered a fully operational, self-perpetuating structure that accesses, and interoperates with 306, the AI module 304. In such an environment, AI can preferably govern the formation and operation of infrastructure domain 302.

FIG. 3 shows a schematic diagram of a maturity stage AI-based Self-Governing Infrastructure Process 402. At 403, an infrastructure commissioning (phase 1) is shown. At inception 410, procurement and placement 404 of constituent components is shown.

Installation and development are shown at 406. Installation and development 406 may preferably include elaboration 412 on the infrastructure as installed.

Verification and acceptance 408 of the infrastructure as installed follows elaboration 412. Once an infrastructure design is verified and accepted, it is preferably self-certified as shown at 414.

At 416, an infrastructure commissioning (phase 2) is shown. A release/deployment is shown at 418. The capacity is validated at 420—i.e., the current infrastructure capacity is validated as corresponding to meet the needs of the existing infrastructure capacity specification.

At 422, production and promotion of various constituent components are shown. Steady state is achieved, as shown at 424. The infrastructure commissioning (phase 2) at 416 is shown as providing configuration management 426.

It should be noted that there is a process divider disposed between 416, infrastructure commissioning (phase 1) 403 and infrastructure commissioning (phase 2) 416. There is also a process divider between infrastructure commissioning (phase 2) 416 and infrastructure decommissioning (phase 3) 428. To further partition the process, internal zones 436 are shown as separated from Total Life Cycle Management (TLM) 438 and AI module 440. Furthermore, a corporate intranet boundary 405 is shown as isolating the internal operations from the external operations.

TLM 438 indicates the fact that the processes set forth herein—i.e., phase 1 403, phase 2 416 and phase 3 428—represent the entire infrastructure life cycle.

AI module 440 may include one or more of the following aspects-design baseline, regulations/requirements/specifications, resource mobilizations, self-alerting & triggers, service level agreements (SLAs), dashboard management, feedback/corrective loop mechanisms, an ongoing events feed, state transitioning, end user standards, manual/semi-automatic modes and interfaces to receive instructions from same, self-check standards, release timelines, target dates, infrastructure methodologies and best practices.

FIG. 5 shows a schematic diagram of a Lifecycle Management Solutions (LMS) analysis for an AI-based Self-Governing Infrastructure, including a quantified lifecycle section of use cases in accordance with the disclosure as set forth herein.

Essentially, FIG. 5 sets forth exemplary algorithm(s) for use with AI according to the disclosure.

For M lifecycle phases, such phases including build/deploy/decommission/and possibly others (each of the phases possibly having N stages—build may have a procure provision stage, an install stage, a certify stage, etc., deploy might have a schedule performance release change and so on, just to name a few examples):

The AI selects, at step 1, a path of *least* resources expenditure or loss—i.e., max gain to the entity.

For use with the foregoing algorithm, EV=Expected resource Values and integrated EF (Effective Financials—i.e., Resource Consumption).

The selection is obtain as follows: At 502, EF is set=to SUM {i=1, N j=1, M, K=1,L}, [EV (i,j,k)] at each k fulfilling 2. below, where step 2 is defined at 504.

At step 2 504, EV (i,j,k)=MIN {Prob (i,j,k)×Resource Cost (i,j,k) at given stage (i) and phase (j) where:

at 506, 2*a*. L=total lanes available at each decision point in multi-step N stage(s), at 508, 2*b*. Prob=likelihood of occurrence=1−(value of likelihood of failure to occur), at 510, 2*c*. Resource Cost=lost (earned) value including time and resource utilizations, and, at 512, 3. SUM (k=1, L) {Prob (i,j,k)}=100% at a given I from 1 . . . . N, j from 1 . . . . M.

Considering the foregoing, the following explanations further describe the algorithm. AI according to the disclosure is aware of 2*a*, 2*b*, and 2*c* from earlier-in-time learning—for example, earned value from past infrastructure projects. When the earlier-in-time learning is insufficient, the AI may attempt to bootstrap the current state and its associated knowledge. If this attempt falls short, then the system may call for human intervention, via a human interface module, in order to establish estimates vis-à-vis a completed infrastructure or, alternatively, a completed infrastructure project.

In preferred embodiments, AI according to the disclosure improves calculations of individual EVs and integrated EFs each cycle. The AI-aware design does this by comparing proposed infrastructure development with actual schedule, resource consumption, resource utilization as the AI-aware design executes each stage (i) of a multi-phase (j) initiative.

Thus, methods and apparatus provide artificial intelligence (AI)-based self-governing infrastructure. Persons skilled in the art will appreciate that the present invention can be practiced by other than the described embodiments, which are presented for purposes of illustration rather than of limitation, and that the present invention is limited only by the claims that follow.

What is claimed is:

1. A non-transitory computer-readable media storing computer-executable instructions that, when executed by a processor on a computer, cause the computer to perform a method for supporting an Artificial Intelligence aware (AI-aware) self-governing infrastructure design, the method comprising;

providing the AI-aware, self-governing, infrastructure design;

prompting the design to requisition constituent components required for a build-out of the design;

in response to the prompting, using the design to initiate a plurality of tickets, said plurality of tickets for procuring constituent components;

using the design to confirm that the initiated tickets, upon fulfillment of the tickets, are sufficient to place the design in a condition of viability;

following the fulfillment of the tickets, using the design to self-certify operability; and using the design to seek end-user acceptance of the operability of the build-out of the design.

2. The media of claim 1, further comprising maintaining the AI design as decision-making capable, and further configured to receive human intervention, said human intervention for enabling a plurality of aspects of design customization.

3. The media of claim 1, further comprising maintaining the AI design as decision-making capable, and further configured to receive human intervention, said human intervention for enabling design self-correction.

4. The media of claim 1, further comprising maintaining the AI design as decision-making capable, and further configured to receive human intervention, said human intervention for enable aspects of design correction.

5. The media of claim 1, further comprising using the design to place the procured constituent components.

6. The media of claim 5, wherein the using the design to self-certify operability occurs only after physical placement of the procured constituent components.

7. The media of claim 1, further comprising using the design to install the procured constituent components.

8. The media of claim 7, wherein the using the design to self-certify operability occurs only after the installation of the procured constituent components.

9. A non-transitory computer-readable media storing computer-executable instructions that, when executed by a processor on a computer, cause the computer to perform a method for maintaining steady-state operation of an Artificial Intelligence aware (AI-aware) self-governing infrastructure design, the method comprising;

providing the AI-aware, self-governing, infrastructure design;

launching deployment automation of the design;

using the design to validate correspondence of a design capacity to an existing infrastructure capacity specification;

upon a failure to validate the correspondence of the design capacity to the existing infrastructure capacity specification, self-correcting a configuration of the design;

in response to the self-correcting, using the design to initiate a plurality of tickets, said plurality of tickets for procuring constituent components;

using the design to confirm that the initiated tickets, upon fulfillment of the tickets, are sufficient to correspond the design to the existing infrastructure capacity specification;

following the fulfillment of the tickets, using the design to self-certify correspondence of the design to the existing infrastructure capacity specification and to self-certify operability; and using the design to seek end-user acceptance of the correspondence to the existing infrastructure capacity specification and operability of a self-corrected build-out of the design.

10. The media of claim 9, further comprising monitoring the design as decision-making capable, and further configured to receive human intervention, said human intervention for enabling a plurality of aspects of design customization.

11. The media of claim 9, further comprising maintaining the AI design as decision-making capable, and further configured to receive human intervention, said human intervention for enable aspects of design correction.

12. The media of claim 9, further comprising using the design to place the procured constituent components.

13. The media of claim 9, further comprising using the design to install the procured constituent components.

14. The media of claim 13, wherein the using the design to self-certify operability occurs only after the installation of the procured constituent components.

15. The media of claim 1, further comprising receiving and recording in design warranty information for the procured components.

16. A method for providing an Artificial Intelligence aware (AI-aware) self-governing infrastructure design, the method comprising;

providing the AI-aware, self-governing, infrastructure design;

prompting the design to requisition constituent components required for a build-out of the design;

in response to the prompting, using the design to initiate a plurality of tickets, said plurality of tickets for procuring constituent components;

using the design to confirm that the initiated tickets, upon fulfillment of the tickets, are sufficient to place the design in a condition of viability;

following the fulfillment of the tickets, using the design to self-certify operability;

using the design to seek end-user acceptance of the operability of the build-out of the design;

maintaining the AI design as decision-making capable, and further configured to receive human intervention, said human intervention for enabling a plurality of aspects of design customizations;

managing physical shutdown of a plurality of ports and a plurality of connections, each of the plurality of ports and the plurality of connections associated with the design; and creating a second plurality of tickets for removing a set of pre-determined entries from the build-out.

17. The method of claim 16, further comprising scheduling a series of decommissions of existing constituents, said scheduling the series of decommissions being based, at least in part, on the creating the second plurality of tickets for taking pre-determined entries off the design record.

18. The method of claim 16, using the design to recover information relating to a plurality of faults related to the design and using the design to provide a root cause analysis of the plurality of faults.

* * * * *